US010068899B2

(12) United States Patent
Melville et al.

(10) Patent No.: US 10,068,899 B2
(45) Date of Patent: Sep. 4, 2018

(54) IC STRUCTURE ON TWO SIDES OF SUBSTRATE AND METHOD OF FORMING

(71) Applicant: GLOBALFOUNDRIES Inc., Grand Cayman (KY)

(72) Inventors: Ian D. W. Melville, Highland, NY (US); Mukta G. Farooq, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/239,976

(22) Filed: Aug. 18, 2016

(65) Prior Publication Data

US 2018/0053743 A1    Feb. 22, 2018

(51) Int. Cl.
| | |
|---|---|
| *H01L 27/06* | (2006.01) |
| *H01L 21/768* | (2006.01) |
| *H01L 23/48* | (2006.01) |
| *H01L 25/065* | (2006.01) |
| *H01L 25/00* | (2006.01) |

(52) U.S. Cl.
CPC .... *H01L 27/0694* (2013.01); *H01L 21/76877* (2013.01); *H01L 21/76898* (2013.01); *H01L 23/481* (2013.01); *H01L 25/0652* (2013.01); *H01L 25/0657* (2013.01); *H01L 25/50* (2013.01); *H01L 2225/06517* (2013.01); *H01L 2225/06541* (2013.01)

(58) Field of Classification Search
CPC ............. H01L 23/481; H01L 21/76898; H01L 21/8221; H01L 27/0688; H01L 25/0657; H01L 2225/06541; H01L 27/0694
See application file for complete search history.

(56) References Cited

U.S. PATENT DOCUMENTS

| | | | | |
|---|---|---|---|---|
| 5,324,980 | A * | 6/1994 | Kusunoki | ........... H01L 27/0688 257/723 |
| 6,150,708 | A * | 11/2000 | Gardner | .............. H01L 21/8221 257/446 |
| 8,476,708 | B2 * | 7/2013 | Fukuzumi | ........... H01L 27/0688 257/326 |
| 9,024,408 | B2 | 5/2015 | Fang | |
| 9,412,788 | B2 * | 8/2016 | Yokoyama | .......... H01L 27/0694 |
| 2005/0233493 | A1 * | 10/2005 | Augusto, Jr. | .......... G02B 1/005 438/51 |

(Continued)

OTHER PUBLICATIONS

Henning, et al., "Thermal Considerations for Monolithic Integration of Three-Dimensional Integrated Circuits" (2013).

*Primary Examiner* — Marvin Payen
*Assistant Examiner* — Jeremy Joy
(74) *Attorney, Agent, or Firm* — Yuanmin Cai; Hoffman Warnick LLC

(57) ABSTRACT

An integrated circuit (IC) structure uses a single semiconductor substrate having a first side and an opposing, second side. A first plurality of active devices are positioned on the first side of the single semiconductor substrate, and a second plurality of active devices are positioned on the opposing, second side of the single semiconductor substrate. A TSV may electrically couple active devices on either side. Use of a single semiconductor substrate with active devices on both sides reduces the number of semiconductor layers used and allows annealing without damaging BEOL interconnects during fabrication.

17 Claims, 6 Drawing Sheets

(56) References Cited

U.S. PATENT DOCUMENTS

| | | | | |
|---|---|---|---|---|
| 2007/0096263 A1* | 5/2007 | Furukawa | ......... | H01L 21/76898 |
| | | | | 257/621 |
| 2008/0179678 A1* | 7/2008 | Dyer | ....................... | H01L 21/84 |
| | | | | 257/351 |
| 2008/0296675 A1* | 12/2008 | Yanagida | ............ | H01L 27/0694 |
| | | | | 257/334 |
| 2010/0176506 A1* | 7/2010 | Hsu | ....................... | H01L 23/481 |
| | | | | 257/698 |
| 2010/0224876 A1* | 9/2010 | Zhu | .................. | H01L 21/76898 |
| | | | | 257/52 |
| 2011/0193197 A1* | 8/2011 | Farooq | .............. | H01L 21/76898 |
| | | | | 257/618 |
| 2015/0091066 A1* | 4/2015 | Lee | .................. | H01L 21/76898 |
| | | | | 257/255 |

* cited by examiner

IC STRUCTURE ON TWO SIDES OF SUBSTRATE AND METHOD OF FORMING

BACKGROUND

The present disclosure relates to integrated circuit (IC) structures, and more specifically, to an IC structure having active devices on two sides of a single semiconductor substrate and a method of forming same.

Integrated circuit structures continue to scale to smaller sizes with increased circuit density within each chip. One approach to continue to decrease chip package size, e.g., from 22 nanometers to 14 nanometers and beyond, employs monolithic three dimensional (3D) structures. Monolithic 3D structures use stacked chips and/or increasing numbers of successive semiconductor layers. In formation of the transistor and other active devices on the various semiconductor layers in monolithic 3D structures, anneals are performed to activate the devices, e.g., to diffuse dopants on the semiconductor layers. As the IC structures are formed, back-end-of-line (BEOL) and far BEOL (FBEOL) copper interconnects are formed over the active devices to scale the wiring. One limitation to continued use of monolithic 3D structures is that the anneals necessary to activate active devices in the various semiconductor layers ideally use temperatures above 400° C., which can also damage previously formed BEOL and FBEOL interconnect structures. Approaches to address this challenge employ laser annealing to activate active devices in the semiconductor layers, and shield layers to protect other interconnect layers. The use of the shield layers increases costs and process time.

SUMMARY

A first aspect of the disclosure is directed to an integrated circuit (IC) structure, comprising: a single semiconductor substrate having a first side and an opposing, second side; a first plurality of active devices on the first side of the single semiconductor substrate; and a second plurality of active devices on the opposing, second side of the single semiconductor substrate.

A second aspect of the disclosure includes a method, comprising: forming a first plurality of active devices on a first side of a single semiconductor substrate; and forming a second plurality of active devices on an opposing, second side of the single semiconductor substrate.

A third aspect of the disclosure related to an integrated circuit (IC) structure, comprising: a single semiconductor substrate having a first side and an opposing, second side; a first plurality of active devices on the first side of the single semiconductor substrate; a second plurality of active devices on the opposing, second side of the single semiconductor substrate; and at least one through silicon via (TSV) electrically coupling at least one of the first plurality of active devices and at least one of the second plurality of active devices.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

An integrated circuit (IC) structure uses a single semiconductor substrate having a first side and an opposing, second side. A first plurality of active devices are positioned on the first side of the single semiconductor substrate, and a second plurality of active devices are positioned on the opposing, second side of the single semiconductor substrate. A TSV may electrically couple active devices on either side of the substrate. Among other advantages, use of a single semiconductor substrate with active devices on both sides reduces the number of semiconductor layers used and allows annealing without damaging BEOL interconnects during fabrication.

Figure 4:
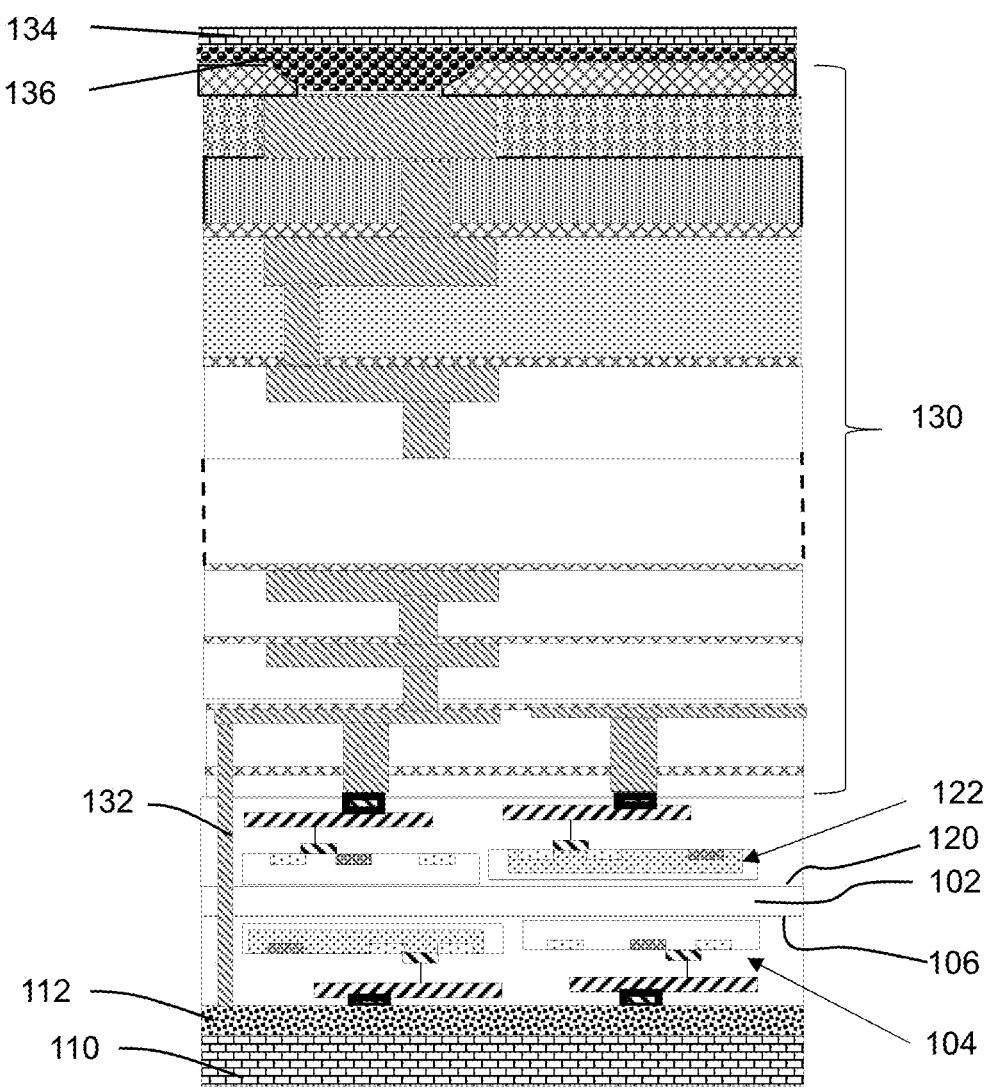
Figure 5:
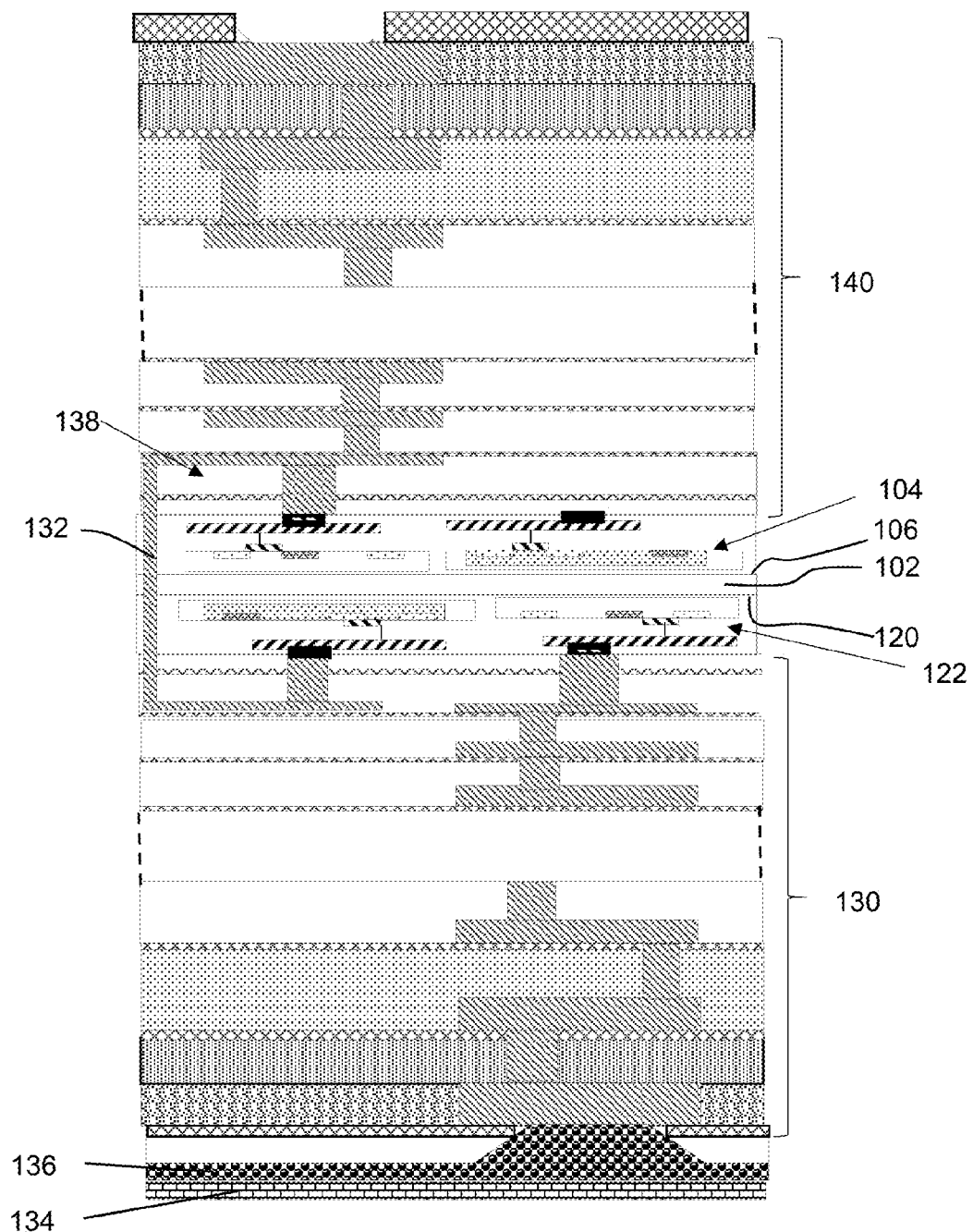
Figure 6:
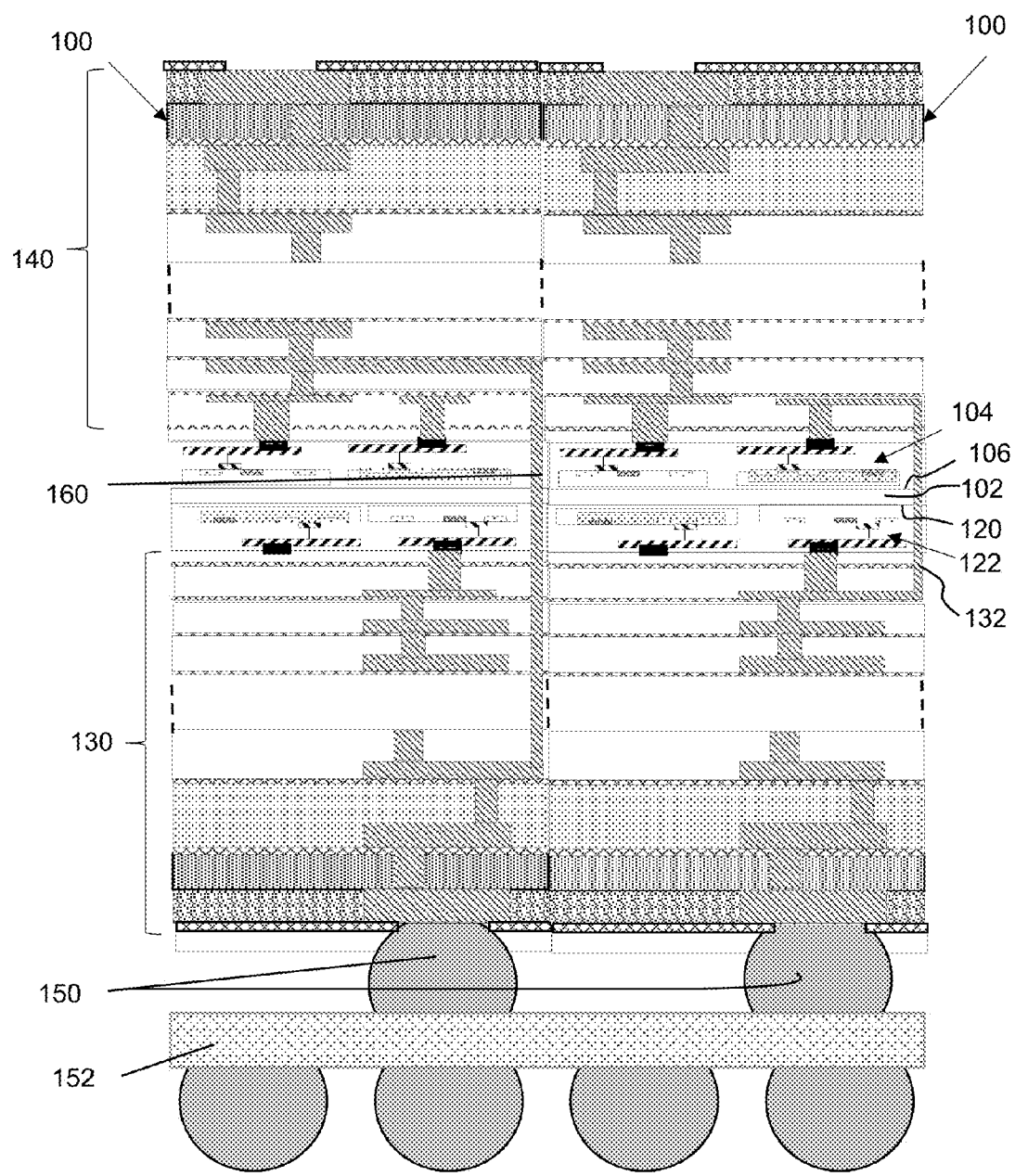

Referring to FIGS. 1-6 show cross-sectional views of steps of a method of fabricating an IC structure according to embodiments of the disclosure, with FIG. 6 showing an IC structure 100 according to embodiments of the disclosure.

Figure 1:
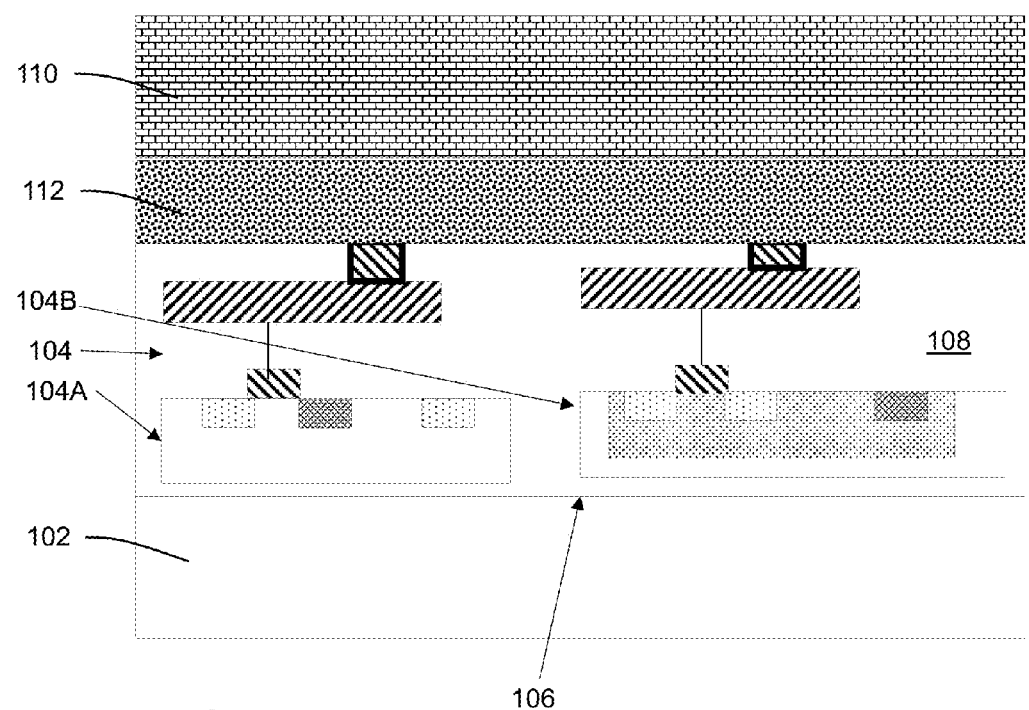
FIGS. 1-6 show cross-sectional views of a method fabricating an IC structure with FIG. 6 showing embodiments of an IC structure, according to embodiments of the disclosure.

FIG. 1 shows a single semiconductor substrate 102 upon which fabrication of active devices according to embodiments of the disclosure will be fabricated. Semiconductor substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate 102 may be strained. While substrate 102 includes a single layer of semiconductor material, it is emphasized that the teachings of the disclosure are equally applicable to semiconductor-on-insulator (SOI) substrates.

FIG. 1 also shows forming a first plurality of active devices 104 on a first side 106 of single semiconductor substrate 102. Active devices 104 may include any now known or later developed semiconductor device such as but not limited to: transistors and other logic structures, memory cells, resistors, etc. As illustrated, one active device 104A includes an n-type field effect transistor (NFET) and another active device 104B includes a p-type field effect transistor (PFET). While two transistors 104A, 104B have been illustrated, it is understood that a large number of transistors or other active devices may be formed. With the exception of when activation anneal(s) are performed, transistors 104A, 104B or other active devices may be formed on substrate 102 using any now known or later developed semiconductor fabrication techniques, e.g., deposition, photolithographic or sidewall transfer patterning, etching, planarization, dopant implants, etc. Transistors 104A, 104B are shown formed in an epitaxial semiconductor layer 108 atop substrate 102, but may be formed in a variety of alternative fashions on first side 106 of substrate 102.

In FIG. 1, a carrier element 110 is also shown attached to layer 108 by, for example, a silicon oxide bond layer 112. As understood in the field, carrier element 110 may include any layer of material capable of allowing the structure to be handled, e.g., by a wafer handling system.

Figure 2:
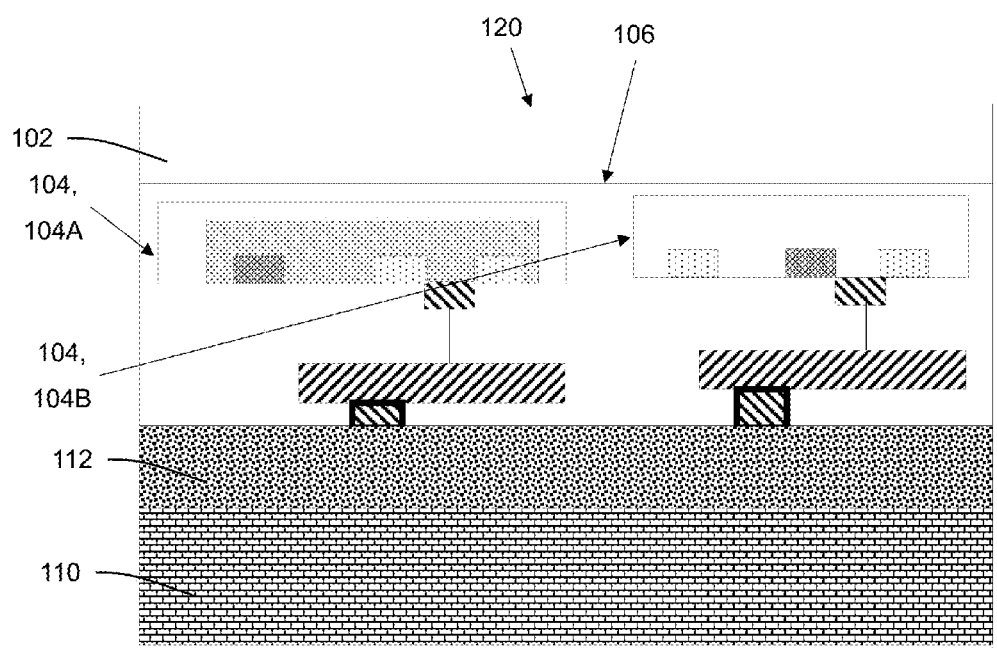

FIG. 2 shows the structure of FIG. 1 flipped over such that a second side 120 of substrate 102, opposing first side 106, is on top. At this stage, single semiconductor substrate 102 may be thinned, e.g., by grinding, polishing, etching, chemical mechanical planarization (CMP) or other thinning technique, by removing material from second side 120. In one example, substrate 102 may be thinned to less than 100 micrometers (μm). As will be described herein, as a result of the thinning, first plurality of active devices 104 may be less than 100 micrometers (μm) from a second plurality of active devices 122 (FIG. 3) to be formed on second side 120.

Figure 3:
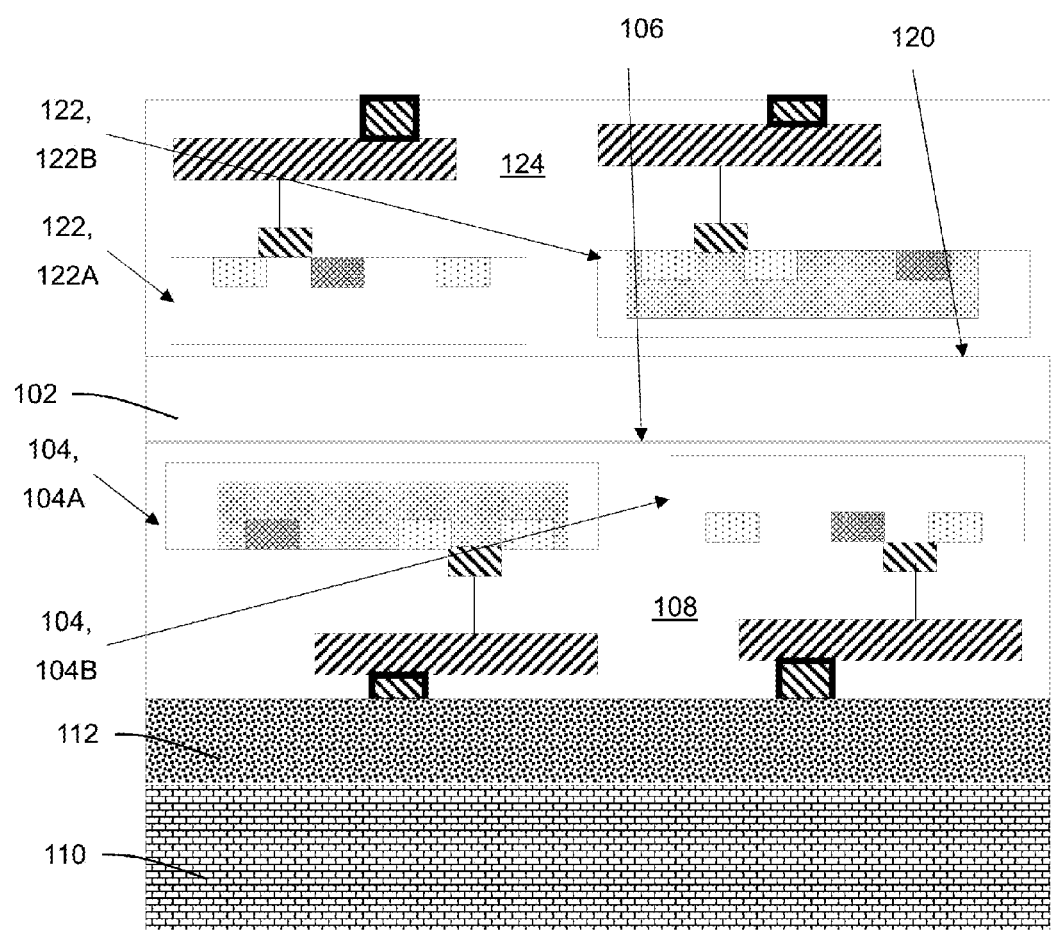

FIG. 3 shows forming a second plurality of active devices 122 on opposing, second side 120 of single semiconductor substrate 102. Active devices 122 may include any now known or later developed semiconductor device such as but not limited to: transistors and other logic structures, memory cells, resistors, etc. As illustrated, one active device 122A includes an NFET and another active device 122B includes a PFET. While two transistors 122A, 122B have been illustrated, it is understood that a large number of transistors or other active devices may be formed. With the exception of when activation anneal(s) are performed according to embodiments of the disclosure, transistors 122A, 122B or other active devices may be formed on substrate 102 using any now known or later developed semiconductor fabrication techniques, e.g., deposition, photolithographic or sidewall transfer patterning, etching, planarization, dopant implants, etc. Transistors 122A, 122B are shown formed in an epitaxial semiconductor layer 124 atop second side 120 of substrate 102, but may be formed in a variety of alternative fashions.

First plurality of active devices 104 on first side 106 and second plurality of active devices 122 on second side 120 do not need to be identical, and may be different in size (e.g., 22 nm versus 10 nm) and/or type, i.e., different active devices such as transistors and memory cells. That is, first plurality of active devices 104 may have at least one of a different size and a different type than second plurality of active devices 122.

At the FIG. 2 and/or FIG. 3 stage, an anneal may be performed to activate first and/or second plurality of active devices 104, 122. As the anneal(s) occur prior to forming either of a first BEOL interconnect structure 130 (FIG. 4) and a second BEOL interconnect structure 140 (FIG. 5), the activation anneal(s) can occur without regard to limitations on temperatures that could damage the BEOL interconnect structures. Temperatures, therefore, can exceed those that would normally damage BEOL interconnect structures, e.g., they may exceed 1000° C. In contrast to conventional techniques, no shielding layers are necessary to perform the anneals, thus saving on costs and process time.

FIG. 4 shows forming a first back-end-of-line (BEOL) interconnect structure 130 electrically coupled to at least one of second plurality of active devices 122 on second side 120 of single semiconductor substrate 102. First BEOL interconnect structure 130 may include any now known or later developed interconnect structure 130, and may as illustrated increase in wire size with each layer. As used herein, "BEOL interconnect structure" includes any interconnect layers formed over semiconductor substrate 102 in the course of device manufacturing following first metallization, and may include any structure considered BEOL or far BEOL (FBEOL) in the industry.

First BEOL interconnect structure 130 may be formed using any now known or later developed semiconductor fabrication techniques, e.g., dielectric layer deposition, photolithographic/SIT patterning of wire/via openings, deposition of conductors (perhaps with liners), planarization, etc. As understood, each BEOL interconnect structure 130 layer may include a dielectric layer with metal wires (extending across layers) and/or vias (extending vertically between metal wires) formed therein. The dielectric layers may include may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Metal wires, vias and through silicon vias (TSVs) may include, for example, copper within a refractory metal liner.

In one embodiment, as part of first BEOL interconnect structure 130 formation, at least one through silicon via (TSV) 132 may be (partially) formed to (eventually) electrically couple at least one of second plurality of active devices 122 and first BEOL interconnect structure 130 (e.g., a metal wire or via within first BEOL interconnect structure 130) to at least one of first plurality of active devices 104 and a second BEOL interconnect structure 140 (to be formed in FIG. 5). TSVs are vertically extending interconnects that passes through a semiconductor substrate 102. In an alternative embodiment, described herein, TSV 132 formation may be performed later, for example, after at least some of BEOL interconnect structure formation as will be described herein and/or as known in the art. After formation of first BEOL interconnect structure 130, a temporary carrier element 134 may be adhesively coupled to first BEOL interconnect structure 130 by temporary adhesive 136.

FIG. 5 shows the structure of FIG. 4 flipped and carrier element 110 (FIG. 4) removed, which would expose first active devices 104. FIG. 5 further shows forming a second BEOL interconnect structure 140 electrically coupled to at least one of first plurality of active devices 104 on first side 106 of single semiconductor substrate 102. Second BEOL interconnect structure 140 may include any now known or later developed interconnect structure, and may as illustrated increase in wire size with each layer. Second BEOL interconnect structure 140 may be formed using any now known or later developed semiconductor fabrication techniques, e.g., dielectric layer deposition, photolithographic/SIT patterning of wire/via openings, deposition of conductors (perhaps with liners), planarization, etc. Further, second BEOL interconnect structure 140 may include any of the material listed herein relative to first BEOL interconnect layer 130.

FIG. 5 also shows forming at least one TSV 132 electrically coupling at least one of the first plurality of active devices 104 (perhaps using part of second BEOL interconnect structure 140) and at least one of second plurality of active devices 122 (perhaps using part of first BEOL interconnect structure 130). This step may include finishing TSV 132, as shown in FIG. 4, or completely forming TSV 132 (preferable) as part of or after formation of one of the second BEOL interconnect structure 140 layers. In FIG. 5, TSV 132 may be formed after formation of layer 138 of second BEOL interconnect structure 140.

FIG. 6 shows a pair of interconnect structures 100 formed according to the above-described methodology coupled side-by-side according to conventional processes. FIG. 6 also shows forming at least one external interconnect 150 electrically coupling one of first BEOL interconnect structure 130 and second BEOL interconnect structure 140 to an external circuit board 152 (first BEOL interconnect structure 130 as shown). External interconnect 150 may be formed using any known or later developed fashion and may include any now known or later developed external interconnect, e.g., a controlled collapse chip connect (C4), copper pillar (CuP), micro-pillar, etc. FIG. 6 also shows an alternative TSV 160, formed during formation of one or both of first and second BEOL interconnect structures 130, 140 of the IC structure 100 on the left in FIG. 6. TSV 160 is shown interconnecting layers of BEOL interconnect structures 130, 140, i.e., away from active devices 104, 122. As will be appreciated, TSVs 132, 160 may electrically couple practically any structures within IC structure 100 through semiconductor substrate 102.

Each IC structure 100 may include single semiconductor substrate 102 having first side 106 and opposing, second side 122. A first plurality of active devices 104 is positioned on first side 106 of single semiconductor substrate 102, and a second plurality of active devices 122 is positioned on opposing, second side 120 of single semiconductor substrate 102. In one embodiment, first plurality of active devices 104 may be less than 100 μm from second plurality of active devices 122. First plurality of active devices 104 may have at least one of a different size and a different type than second plurality of active devices 122. IC structure 100 may also include first BEOL interconnect structure 130 electrically coupling to at least one of second plurality of active devices 122 on second side 120 of single semiconductor substrate 102, and second BEOL interconnect structure 140 electrically coupling to at least one of first plurality of active devices 104 on first side 106 of single semiconductor substrate 102. At least one TSV 132, 160 electrically couples at least one of first plurality of active devices 104 and first BEOL interconnect structure 130 to at least one of second plurality of active devices 122 and second BEOL interconnect structure 140. In particular, at least one TSV 132 may electrically couple at least one of first plurality of active devices 104 to at least one of second plurality of active devices 122. IC structure 100 may also include at least one external interconnect 150 electrically coupling one of first and second BEOL interconnect structure 130, 140 (130 as shown) to an external circuit board 152.

IC structure 100 and the methods described herein allow for formation of a three-dimensional IC structure in such a fashion to maximize semiconductor substrate 102 usage by building active devices on both side of the substrate. IC structure 100 has improved dimensions compared to conventional monolithic 3D structures, even with TSVs provided. IC structure 100 thus provides increased functional volume, enabling smaller chip footprint or greatly expanded functionality with the same footprint. Also, various combinations of active devices can be employed on a single substrate 102. Active devices and other structure on either side of substrate 102 can be accessed by TSVs 132, 160 of various depths, sizes, etc. IC structure 100 also provides the potential to reduce off chip input/output communication, enabling faster devices, and reducing thermal cooling issues by enabling load sharing of logic cores across both sides of substrate 102. The methodology also allows formation of IC structure 100 without the concerns of damaging BEOL layers with activation anneals because the BEOL interconnect structures are not present at the time of the anneal(s). Thus, no shielding layers are required, saving on costs and process time. Since a single semiconductor substrate 102 is employed, the methodology also reduces costs compared to devices using numerous semiconductor layers. The methodology also advantageously does not present a large disruption to current packaging technologies.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
a single semiconductor substrate having a first side and an opposing, second side, wherein the single semiconductor substrate includes only a uniform semiconductor layer;
a first plurality of active devices on the first side of the single semiconductor substrate;
a second plurality of active devices on the opposing, second side of the single semiconductor substrate;
at least one through silicon via (TSV) electrically coupling at least one of the first plurality of active devices to at least one of the second plurality of active devices, wherein the at least one of the first plurality of active devices includes an n-type device, wherein the at least one of the second plurality of active devices includes a p-type device, and wherein the at least one TSV electrically couples the n-type device to the p-type device;
a first back-end-of-line (BEOL) interconnect structure electrically coupled to at least one of the second plurality of active devices on the second side of the single semiconductor substrate; and
a second BEOL interconnect structure electrically coupled to at least one of the first plurality of active devices on the first side of the single semiconductor substrate;
wherein the at least one TSV extends entirely through the single semiconductor substrate and through at least one metal layer of the first BEOL interconnect structure.

2. The IC structure of claim 1, further comprising at least one through silicon via (TSV) electrically coupling at least one of the first plurality of active devices and the first BEOL interconnect structure to at least one of the second plurality of active devices and the second BEOL interconnect structure.

3. The IC structure of claim 1, further comprising at least one external interconnect electrically coupling one of the first BEOL interconnect structure and the second BEOL interconnect structure to an external circuit board.

4. The IC structure of claim 1, wherein the first plurality of active devices is less than 100 micrometers (μm) from the second plurality of active devices within the single semiconductor substrate.

5. The IC structure of claim 1, wherein the first plurality of active devices have at least one of a different size and a different type than the second plurality of active devices.

6. The IC structure of claim 1, wherein the TSV extends through at least one metal layer of the second BEOL interconnect structure.

7. A method, comprising:
forming a first plurality of active devices on a first side of a single semiconductor substrate, wherein a first one of the first plurality of active devices includes an n-type device, and wherein a second one of the first plurality of active devices includes a p-type device;
forming a second plurality of active devices on an opposing, second side of the single semiconductor substrate, wherein the second plurality of active devices includes a p-type device;
after forming the first plurality of active devices and the second plurality of active devices, forming a first back-end-of-line (BEOL) interconnect structure electrically coupled to at least one of the second plurality of active devices on the second side of the single semiconductor substrate;
forming a second BEOL interconnect structure electrically coupled to at least one of the first plurality of active devices on the first side of the single semiconductor substrate, wherein the single semiconductor substrate includes only a uniform semiconductor layer; and
after forming at least a portion of the first BEOL interconnect structure, forming at least one through silicon via (TSV) electrically coupling the n-type device of the first plurality of active devices to the p-type device of the second plurality of active devices;
wherein the at least one TSV extends entirely through the single semiconductor substrate and through at least one metal layer of the first BEOL interconnect structure.

8. The method of claim 7, further comprising forming at least one through silicon via (TSV) electrically coupling at least one of the first plurality of active devices and the first BEOL interconnect structure to at least one of the second plurality of active devices and the second BEOL interconnect structure.

9. The method of claim 7, further comprising performing an anneal to activate the first plurality of active devices and the second plurality of active devices prior to forming either of the first BEOL interconnect structure and the second BEOL interconnect structure.

10. The method of claim 7, further comprising thinning the single semiconductor wafer prior to forming the second plurality of active devices on the opposing, second side such that the first plurality of active devices is less than 100 micrometers (μm) from the second plurality of active devices within the single semiconductor substrate after forming the second plurality of active devices.

11. The method of claim 7, wherein the first plurality of active devices have at least one of a different size and a different type than the second plurality of active devices.

12. The method of claim 7, wherein the forming of the at least one TSV occurs during or after the forming of the second BEOL interconnect structure.

13. An integrated circuit (IC) structure, comprising:
a single semiconductor substrate having a first side and an opposing, second side, wherein the single semiconductor substrate includes only an undoped semiconductor layer;
a first plurality of active devices in a first device layer on the first side of the single semiconductor substrate;
a second plurality of active devices in a second device layer on the opposing, second side of the single semiconductor substrate;
at least one through silicon via (TSV) electrically coupling at least one of the first plurality of active devices and at least one of the second plurality of active devices, wherein the at least one of the first plurality of active devices includes an n-type device, wherein the at least one of the second plurality of active devices includes a p-type device, and wherein the at least one TSV electrically couples the n-type device to the p-type device;

a first back-end-of-line (BEOL) interconnect structure positioned above the second device layer, wherein the first BEOL interconnect structure is electrically coupled to at least one of the second plurality of active devices on the second side of the single semiconductor substrate; and a second BEOL interconnect structure positioned above the first device layer, wherein the second BEOL interconnect structure is electrically coupled to at least one of the first plurality of active devices on the first side of the single semiconductor substrate;

wherein the at least one TSV extends entirely through the single semiconductor substrate, the first device layer, the second device layer, at least one metal layer of the first BEOL interconnect structure and at least one metal layer of the second BEOL interconnect structure.

14. The IC structure of claim 13, wherein the at least one TSV electrically couples the at least one of the first plurality of active devices to the at least one of the second plurality of active devices through at least one of the first BEOL interconnect structure and the second BEOL interconnect structure.

15. The IC structure of claim 13, further comprising at least one external interconnect electrically coupling one of the first BEOL interconnect structure and the second BEOL interconnect structure to an external circuit board.

16. The IC structure of claim 13, wherein the first plurality of active devices is less than 100 micrometers ($\mu$m) from the second plurality of active devices within the single semiconductor substrate.

17. The IC structure of claim 13, wherein the first plurality of active devices have at least one of a different size and a different type than the second plurality of active devices.

* * * * *